United States Patent
Storm et al.

(10) Patent No.: US 11,220,328 B2
(45) Date of Patent: Jan. 11, 2022

(54) ARRANGEMENT AND SYSTEM FOR MECHANICALLY CHANGING A SURFACE

(71) Applicant: AIRBUS DEFENCE AND SPACE GMBH, Taufkirchen (DE)

(72) Inventors: Stefan Storm, Taufkirchen (DE); Alois Friedberger, Taufkirchen (DE); Ralf Caspari, Taufkirchen (DE)

(73) Assignee: Airbus Defence and Space GmbH, Taufkirchen (DE)

( * ) Notice: Subject to any disclaimer, the term of this patent is extended or adjusted under 35 U.S.C. 154(b) by 67 days.

(21) Appl. No.: 16/780,436

(22) Filed: Feb. 3, 2020

(65) Prior Publication Data
US 2020/0247531 A1 Aug. 6, 2020

(30) Foreign Application Priority Data
Feb. 4, 2019 (DE) ...................... 10 2019 102 634.2

(51) Int. Cl.
*B64C 23/00* (2006.01)
*B64D 15/00* (2006.01)

(52) U.S. Cl.
CPC ............ *B64C 23/005* (2013.01); *B64D 15/00* (2013.01)

(58) Field of Classification Search
CPC ......... B64C 23/005; B64C 3/26; B64C 21/10; B64C 23/04; B64D 15/00; B64D 15/163; B64D 15/16; F15D 1/0075; F15D 1/10; H01L 41/0906; H01L 41/047
See application file for complete search history.

(56) References Cited

U.S. PATENT DOCUMENTS

| 7,988,102 B2 | 8/2011 | Meister |
| 8,400,751 B2 | 3/2013 | Tanaka et al. |
| 8,708,651 B2 * | 4/2014 | Greenblatt ........... H05H 1/2406 416/24 |

(Continued)

FOREIGN PATENT DOCUMENTS

| DE | 10 2017 128 478 A1 | 5/2018 |
| EP | 2 322272 A1 | 5/2011 |
| EP | 2 886 453 A1 | 6/2015 |

OTHER PUBLICATIONS

British Search Report for Application No. 2001199.5 dated Oct. 5, 2020.

(Continued)

*Primary Examiner* — Assres H Woldemaryam
(74) *Attorney, Agent, or Firm* — Jenkins, Wilson, Taylor & Hunt, P.A.

(57) ABSTRACT

An arrangement for mechanically changing a surface includes an insulating layer, a pair of electrodes, which is arranged on or in the insulating layer, and a piezo element, which is arranged on or in the insulating layer. The piezo element is separated from the pair of electrodes by the insulating layer. The pair of electrodes is designed to generate in a region of the piezo element an electric field, which causes the piezo element to carry out a mechanical change of shape, in order in this way to mechanically change a surface of the arrangement. The pair of electrodes is also designed to generate the electric field such that the electric field has a minimum field strength in a surrounding area of the arrangement, in order in this way to generate a plasma in the surrounding area of the arrangement.

13 Claims, 3 Drawing Sheets

(56) References Cited

U.S. PATENT DOCUMENTS

| | | | |
|---|---|---|---|
| 10,155,373 B2* | 12/2018 | Nino | G01M 5/0083 |
| 10,995,780 B2 | 5/2021 | Caspari et al. | |
| 2009/0097976 A1 | 4/2009 | Driver et al. | |
| 2010/0208007 A1* | 8/2010 | Nihei | B41J 2/1645 |
| | | | 347/68 |
| 2011/0198312 A1 | 8/2011 | Tanaka et al. | |
| 2017/0271711 A1* | 9/2017 | Benthien | H01M 4/661 |
| 2018/0149178 A1* | 5/2018 | Caspari | F15D 1/12 |
| 2018/0206321 A1 | 7/2018 | Morfill et al. | |
| 2019/0342985 A1* | 11/2019 | Dadheech | H05H 1/2481 |
| 2020/0180708 A1* | 6/2020 | Khalighi | H05H 1/2406 |

OTHER PUBLICATIONS

German Search Report for Application No. 10 2019 102 634.2 dated Aug. 21, 2019.

* cited by examiner

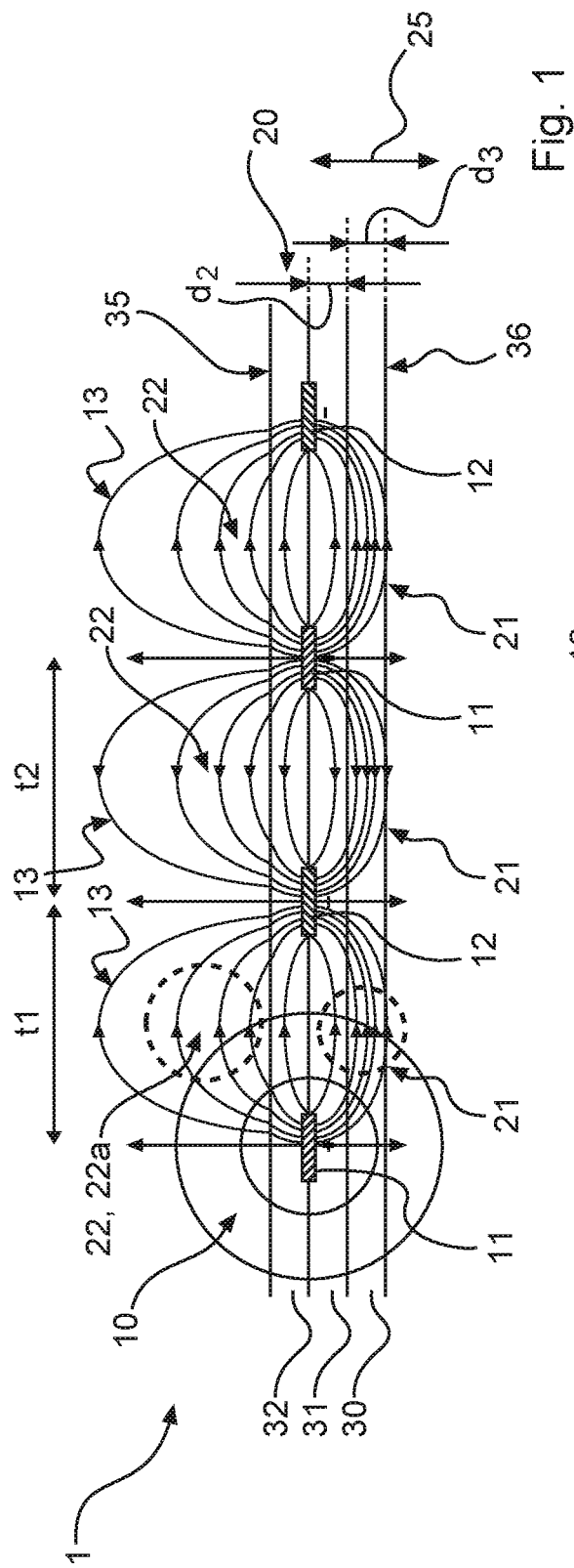
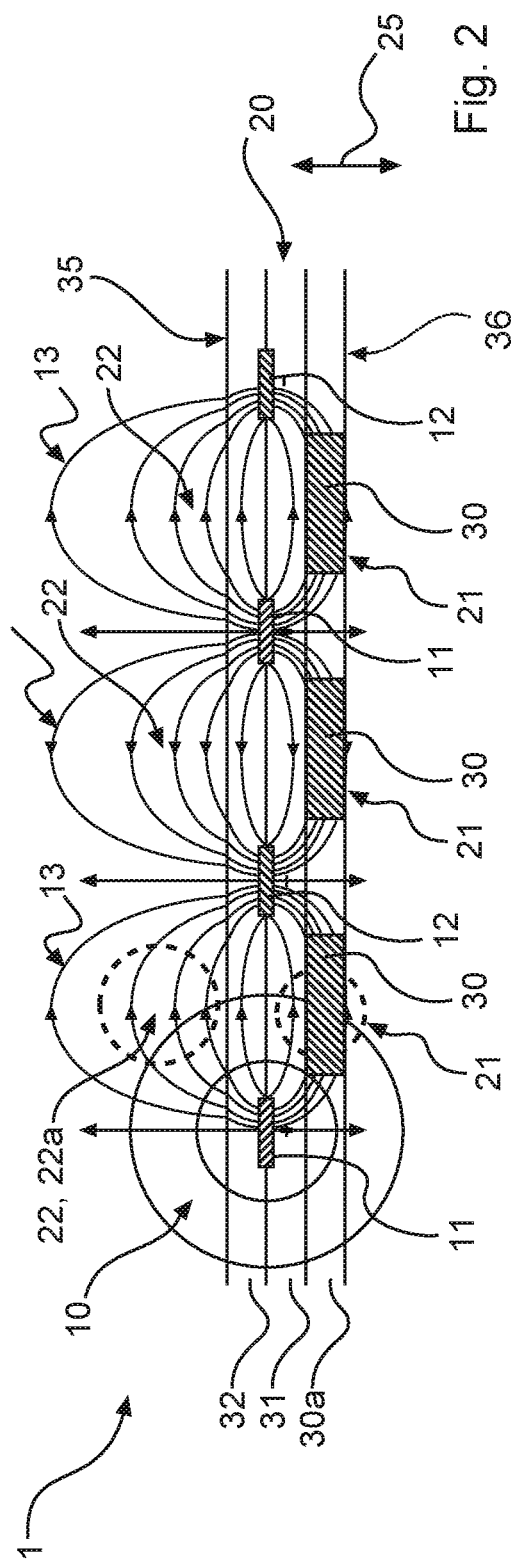

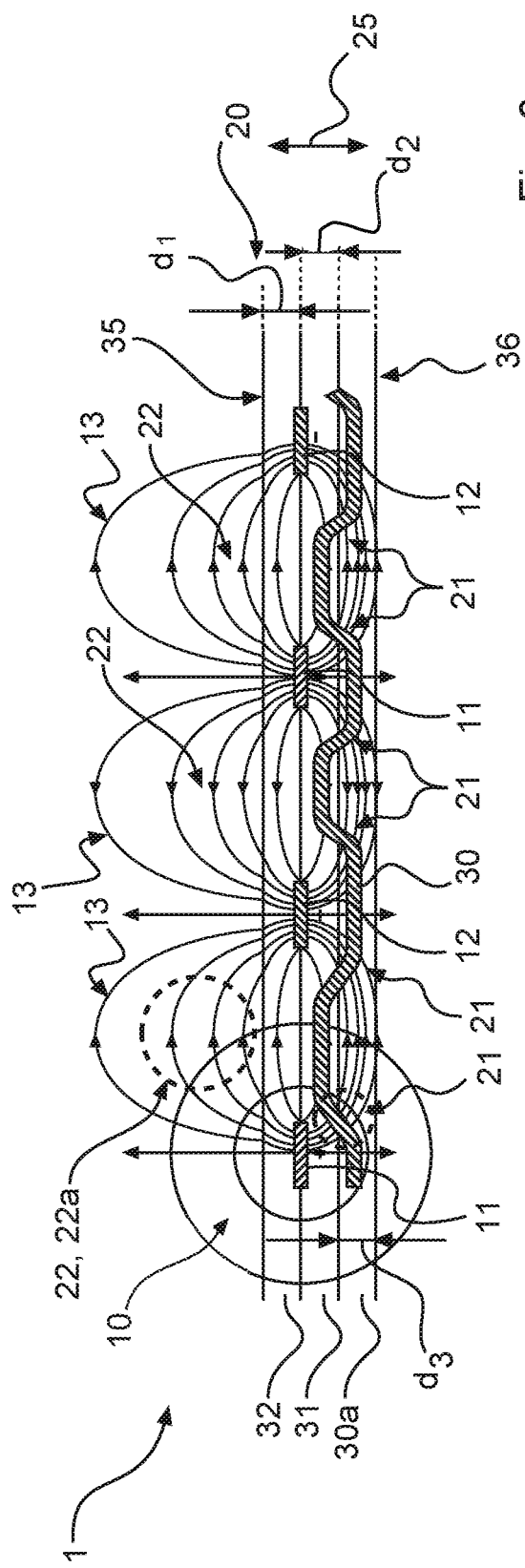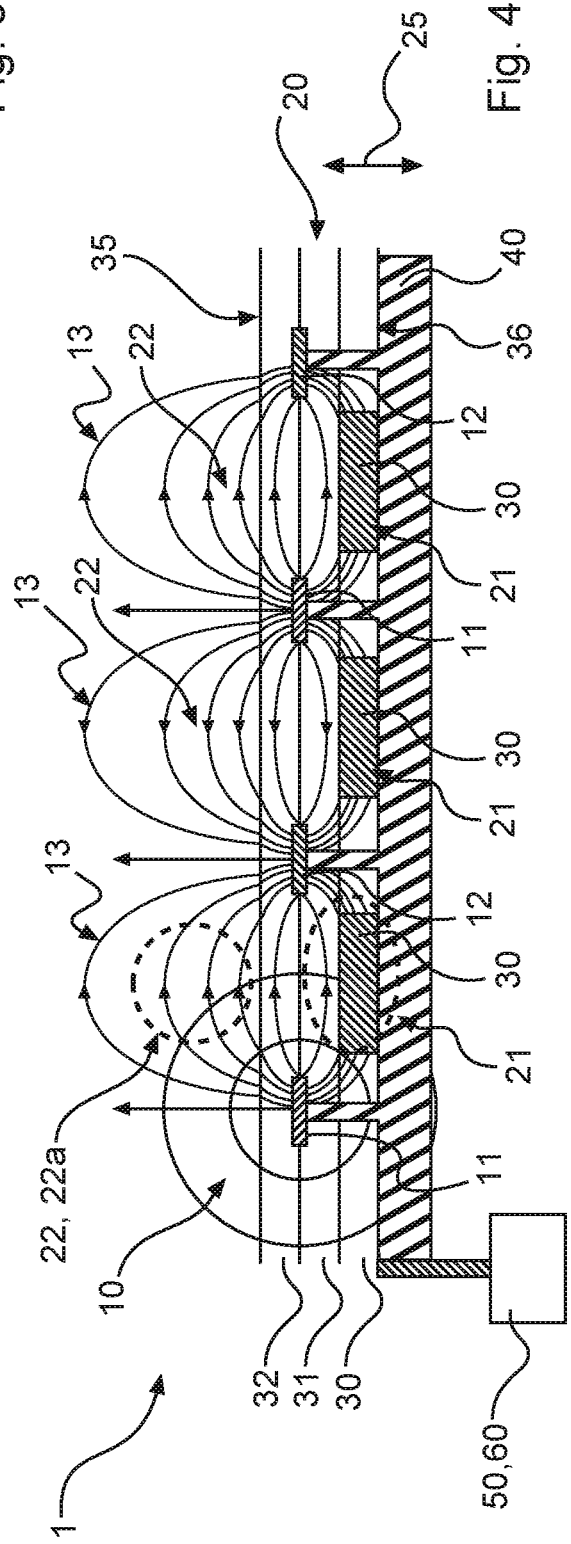

ARRANGEMENT AND SYSTEM FOR MECHANICALLY CHANGING A SURFACE

CROSS-REFERENCE TO RELATED APPLICATION

This application claims priority to German Patent Application DE 10 2019 102 634.2 filed Feb. 4, 2019, the entire disclosure of which is incorporated by reference herein.

TECHNICAL FIELD

The disclosure herein relates to the influencing of flows on component surfaces. In particular, the disclosure herein relates to an arrangement and a system for mechanically changing a surface. Furthermore, the disclosure herein relates to an aerial vehicle with an arrangement for mechanically changing a surface.

BACKGROUND

In aviation in particular, the influencing of component surfaces relevant to flow is of great importance. In this context, soiling of the component surface leads to increased air resistance. Similarly, icing on component surfaces can lead to an increase in air resistance. On aerial vehicles, these contaminating deposits or unevenness on the component surface lead to considerable air resistances, and consequently to increased operating costs of the aerial vehicle. In this context, it may often prove to be laborious and time-consuming to remove these contaminating or icing deposits manually from the component surface. Sometimes it is not even possible to remove such contaminating or icing deposits in the first place, for example if they occur during flight. This then leads to a greater air resistance, and consequently to greater fuel consumption. Similarly, there may be a reduction in lift.

EP 2 886 453 A1 describes a boundary layer control system and an aerial vehicle with such a boundary layer control system. The system has an outlet opening, which is arranged in a skin section of the aerial vehicle, the outlet opening providing a suction force when a flow flows along the skin section.

U.S. Pat. No. 7,988,102 B1 describes an aerial vehicle with a fluid-duct system for extraction of the laminar boundary layer and/or for blowing out fluid in regions on the outer skin, switchable valves being connected to a pumping device, which is driven by air from the cabin.

SUMMARY

An object of the disclosure herein is to improve the mechanical influencing of component surfaces.

This object is achieved by the subject matter and examples disclosed herein.

According to one aspect of the disclosure herein, an arrangement for mechanically changing a surface is provided. The arrangement comprises an insulating layer, a pair of electrodes, which is arranged on or in the insulating layer, and a piezo element, which is arranged on or in the insulating layer. The piezo element is separated from the pair of electrodes by the insulating layer. The pair of electrodes is designed, or configured as used herein, to generate in a region of the piezo element an electric field, which causes the piezo element to carry out a mechanical change of shape, in order in this way to mechanically change a surface of the arrangement. The pair of electrodes is also designed to generate the electric field such that the electric field has a minimum field strength in a surrounding area of the arrangement, in order in this way to generate a plasma in the surrounding area of the arrangement.

With such an arrangement it is possible to change the geometry of a surface of a component, for example a surface flowed around by air, in order in this way for example to remove specifically from the component contaminating deposits, icing deposits, etc., occurring in the region of the surface. It is possible with such an arrangement to provide a de-icing of the surface, in that for example specific frequencies are generated at the surface. The mechanical changing of the surface may for example comprise a changing of the geometry of the surface. The changing of the surface may, however, also be caused by a vibration at a specific frequency, for example about 1 kHz. The mechanical changing of the surface may in this case take place such that the arrangement, in particular the surface of the arrangement, is not damaged. The surface of the arrangement preferably represents a boundary surface with respect to ambient air. The surface may, however, also be a boundary surface with respect to another component. The arrangement may be formed in a modular manner, so that the arrangement can be attached at any desired points of a component.

In the case of the arrangement according to the disclosure herein, the electrodes of the pair of electrodes may in other words be buried in the insulating layer or be arranged on the surface. The two electrodes of a pair of electrodes may in this case be arranged at different distances from the surface. The generation of the plasma serves in this case for removing contaminants or ice on the surface or for reducing accumulations of contaminants or for influencing the flow on the surface. The piezo element serves for producing small mechanical changes at the surface, in order thereby to remove contaminants or ice from the surface or to reduce the accumulation of contaminants or ice. The arrangement can therefore also be used as a de-icing device. The pair of electrodes may in this case generate the electric field in the surrounding area such that the plasma can be generated, so that the pair of electrodes can also be referred to as a plasma generator. This plasma generator and the piezo element can therefore be combined in order to complement one another in their effect or achieve a better effect. The electrodes of the pair of electrodes that are used for the plasma generation therefore generate an electric field, this electric field also permeating the piezo element and being used for the operation thereof. This means that separate electrical contacting of the piezo element can be avoided, which reduces production expenditure.

It is also possible to generate in the surrounding area of the arrangement, in particular in the region of the surface, a plasma which can move or remove particles in the surrounding area, such as for example dust particles. For this purpose, an ionization of particles in the air may take place.

In the case of the arrangement according to the disclosure herein, therefore, an electric field may be generated by the pair of electrodes, so that the electric field strength is locally different in the surrounding area of the pair of electrodes. In this way, in a region of the piezo element arranged in the vicinity of the pair of electrodes, an electric field strength of the electric field can be set in such a way that the piezo element is excited to carry out a mechanical change of shape, which in turn brings about the changing of the surface of the arrangement. For this, the pair of electrodes may be designed to generate the electric field in such a way that at the piezo element there is an electrical voltage which excites the piezo element to carry out the mechanical change of shape. The mechanical change of shape of the piezo element may in this case be equally understood as meaning a change of geometry of the piezo element itself and of the material surrounding it. Therefore, the change of shape of the piezo element brings about a change of shape of the surrounding insulating material, or insulating material in the direct vicinity, of the insulating layer, so that this change of shape is in turn transferred to the surface, which thereby itself undergoes a change of shape. The surface may in this case represent a boundary surface between the insulating layer and the ambient air or a material located on the surface, such as for example soiling or ice.

In the case of the arrangement according to the disclosure herein, the electric field may also be generated by the pair of electrodes such that the electric field strength in a surrounding area of the arrangement is sufficient to generate the plasma. The plasma is in this case preferably generated in the air surrounding the arrangement. In other words, the same electric field that is used for exciting the piezo element is also used to generate the plasma. For this, the electric field generated by the pair of electrodes is generated such that the field strength varies locally in different regions in the arrangement or around the arrangement. This local variation of the electric field strength of the electric field can be achieved on the one hand by the position or alignment of the individual elements within the arrangement and on the other hand by a specific form of the insulating properties of the insulating layer. For example, an electric field with a prescribed field strength in the region of the piezo element may be set by a relative arrangement of the piezo element with respect to the pair of electrodes. Furthermore, a permittivity of the insulating layer in the region of the piezo element or around the piezo element may be set such that the prescribed field strength in the region of the piezo element, which is preferably about 2 kV/mm, is achieved. The electrodes of the pair of electrodes may for example be spaced apart by approximately 0.2 mm.

By analogy with this, the electric field may be set with a further prescribed field strength in the surrounding area of the arrangement by a relative arrangement of the pair of electrodes with respect to the surface of the arrangement. Furthermore, a permittivity of the insulating layer between the pair of electrodes and the surface of the arrangement may be set such that the prescribed field strength in the surrounding area of the arrangement is achieved. The generation of the plasma in the surrounding area of the arrangement requires a minimum field strength, which is preferably about 6 kV/mm.

The excitation of the piezo element by the electric field of the pair of electrodes can advantageously achieve the effect that there is no need for electrical contacting, such as for example that an electrical conductor has to be connected to the piezo element. Rather, the insulating layer may be at least partially permeable to the electric field of the pair of electrodes, so that the electrical excitation of the piezo element takes place exclusively by the electric field generated by the pair of electrodes. The pair of electrodes may have two electrodes, which are arranged distributed in the insulating layer.

The insulating layer may comprise any desired insulating material. The insulating layer may for example comprise a polymer, a ceramic material, silicon dioxide or silicon nitride.

For the purposes of the disclosure herein, a piezo element may be understood as meaning a device which uses the so-called piezo effect to perform a mechanical movement by applying an electrical voltage, which is generated by the electric field at the piezo element. This mechanical movement may be manifested as a change of shape of the piezo element, which in turn excites the surrounding material layer of the insulating layer, and ultimately the surface of the arrangement, to undergo a change of shape.

For the purposes of the disclosure herein, an insulating layer may be understood as meaning an element or a unit which does not conduct electrical current, or only to a small extent. The insulating layer may have a specific permittivity, also referred to as dielectric conductivity, which characterizes the permeability of the material of the insulating layer to the electric field of the pair of electrodes.

According to one embodiment of the disclosure herein, the piezo element is arranged in or on the insulating layer in such a way that the mechanical change of shape of the piezo element takes place in response to an exclusive excitation by the electric field generated by the pair of electrodes.

In this way, the provision of an electrical conductor for contacting the piezo element with a voltage source can be avoided, since the field strength required for the electrical excitation of the piezo element is applied just by the pair of electrodes. This allows the piezo element to be shielded from the surrounding area by the insulating layer, and even to be embedded in the insulating layer. The permittivity of the insulating layer may in this case be set such that a specific field strength that is required for the excitation of the piezo element is achieved in the region of the piezo element. It may also be provided that a specific field strength is not exceeded in the region of the piezo element.

According to one embodiment of the disclosure herein, the piezo element is electrically insulated within the arrangement.

As already mentioned, an electrical insulation can be achieved by the insulating layer, while however the insulating layer remains at least partially permeable to the electric field generated by the pair of electrodes. Contacting of the piezo element with an external voltage source by an electrical conductor can in this way be avoided. It should be understood that, for the field lines, the law of refraction may apply at the boundary surface between the insulating layers of different permittivities, in particular between different sub-layers of the insulating layer.

According to one embodiment of the disclosure herein, the pair of electrodes is arranged with respect to the piezo element in such a way that the generated electric field in the region of the piezo element has a field strength that does not exceed a maximum field strength.

It can in this way be ensured that the piezo element has a long service life. In particular, with high field strengths and high activating frequencies in the region of the piezo element, the piezo element may become heated because of the high active power. Consequently, a maximum field strength in the region of the piezo element may preferably be a maximum of about 2 kV/mm. However, it is also possible that the field strength is even a maximum of about 2.6 kV/mm. When the piezo element is excited with natural resonance, the electric field strength can be reduced down to 0.1 kV/mm in the region of the piezo element, while retaining the same deformation.

According to one embodiment of the disclosure herein, the arrangement also has a control unit, which is designed to set a voltage frequency for the pair of electrodes in order thereby to vary a degree of ionization of the generated plasma in the surrounding area of the arrangement and/or vary the mechanical change of shape performed by the piezo element.

The control unit may be a processor, which controls a voltage source for the arrangement. The voltage source may apply a voltage to the pair of electrodes. For example, it may be an external voltage source or a voltage source separate from the arrangement, which applies a voltage to the pair of electrodes.

The voltage frequency may be set such that the field strength in the region of the piezo element varies. This allows for example an excitation of the piezo element to take place, so that this piezo element performs vibrations at a specific frequency. These vibrations of the piezo element lead in turn to a vibration of the surface at a prescribed frequency, and consequently to the mechanical changing of the surface of the arrangement. A voltage at the pair of electrodes is for example 1.2 kV.

According to one embodiment of the disclosure herein, the arrangement has a plurality of pairs of electrodes, the plurality of pairs of electrodes being designed to generate in locally different regions of the piezo element in each case an electric field that causes the piezo element to perform different mechanical changes of shape in the locally different regions of the piezo element, in order in this way to mechanically change a surface of the arrangement. The features of the pair of electrodes described herein can apply in the case of a plurality of pairs of electrodes to all of the pairs of electrodes.

This is further conducive to the locally different changing of the surface of the arrangement. For example, a first pair of electrodes may generate a first electric field with a first prescribed field strength in a first region of the piezo element, whereby a specific change of shape is induced in the first region of the piezo element. A second pair of electrodes may generate a second electric field with a second prescribed field strength in a second region of the piezo element, whereby a specific change of shape is induced in the second region of the piezo element. This allows different regions of the piezo element to perform changes of shape of different degrees, which in turn leads to changes of shape of different degrees in different regions of the surface.

According to one embodiment of the disclosure herein, the arrangement has a plurality of piezo elements, the pair of electrodes being designed to generate in the region of the plurality of piezo elements an electric field that causes the plurality of piezo elements to perform in each case different mechanical changes of shape, in order in this way to mechanically change a surface of the arrangement. The features of the piezo element described herein can apply in the case of a plurality of piezo elements to all of the piezo elements.

This can be further conducive to the locally different changing of the surface of the arrangement. For example, the pair of electrodes may generate an electric field with a prescribed field strength in the region of a first piezo element, whereby a specific change of shape of the first piezo element is induced. The same electric field may be generated in the region of a second piezo element with a different field strength, whereby a specific change of shape of the second piezo element, which differs from the change of shape of the first piezo element, is induced. This allows different piezo elements to perform changes of shape of different degrees, which in turn leads to changes of shape of different degrees in different regions of the surface.

According to one embodiment of the disclosure herein, the piezo element is integrated in a film.

For example, the film may form at least a part of the insulating layer, the piezo element being integrated in the film. The film may have printed-on conductor tracks, which provide the electrical connection or contacting of the pair of electrodes to or with the voltage source. The arrangement may be at least partially formed as a film, so that the arrangement can be applied to a component surface in a modular manner. This is described still further below.

According to one embodiment of the disclosure herein, the arrangement also has an electrical conductor track, which is electrically connected to the pair of electrodes in order to establish an electrical connection between the pair of electrodes and a separate voltage source.

This allows a voltage to be applied to the pair of electrodes. The conductor track may consequently be at least partially integrated in the arrangement. The conductor track may for example be printed on a film of the arrangement.

It is also possible to integrate the piezo elements in the film. In this case, however, the piezo elements are electrically insulated from the conductor track.

The film may also have a sensor unit, for example with a number of sensors, and the cabling thereof. This makes it possible that the arrangement is also used for the detection of mechanical deformations introduced at the surface. In this case, the reverse piezoelectric effect as it were is used, so that a deformation of the arrangement is transferred to the piezo elements and this deformation is converted by the piezo elements into an electrical signal, which is sensed by the sensor unit, in order in this way to characterize the extent or the type of the external mechanical effect. A corresponding evaluation of the sensed signals can be performed by a control unit. The film may comprise further electronic components, such as voltage transformers or switches. The sensor unit may also have one or more sensors in the form of electrodes. In particular, the electrodes of the pairs of electrodes may be used as sensors, for example in order to sense changes at the surface of the arrangement.

According to one embodiment of the disclosure herein, a distance between the pair of electrodes and the piezo element is variable with respect to a direction perpendicular to the surface.

In this case, the piezo element may for example have an elongated form, specific regions of the piezo element being at different distances from a plane in which the pair of electrodes lies or the pairs of electrodes lie. In this case, it may be provided that the plane in which the electrodes or pairs of electrodes lie runs substantially parallel to the surface of the arrangement. The elongated piezo element may also be at different distances from the surface in different regions along its extent. It is also possible that the plane in which the electrodes or pairs of electrodes lie is at different distances from the surface of the arrangement at locally different points. The pair of electrodes or the pairs of electrodes may also lie in a plane with the piezo element or the piezo elements. These relationships are explained still more specifically in the description of the figures.

According to one embodiment of the disclosure herein, a distance between the insulating layer and a bearing surface of the arrangement is variable with respect to a direction perpendicular to the surface.

In this case, for example, the piezo element may take the form of a layer or sheet, which keeps the insulating layer at a distance from the bearing surface. The bearing surface may for example be a bearing surface for attaching the arrangement on a component.

According to one embodiment of the disclosure herein, the insulating layer has a permittivity that is variable in a direction perpendicular to the surface of the arrangement.

This allows a specific setting of the properties to be performed, in particular the field strength of the electric field generated by the pair of electrodes within the insulating layer. The permittivity preferably increases from the surface of the arrangement in the direction of the piezo element, so that a higher field strength can be provided at the surface or in the surrounding area of the arrangement than in deeper regions of the insulating layer, where the piezo element is located.

According to one aspect of the disclosure herein, an aerial vehicle with the arrangement according to the disclosure herein is provided. The aerial vehicle is for example an aircraft.

According to one aspect of the disclosure herein, a system for mechanically changing a surface is provided. The system has the arrangement according to the disclosure herein and a component structure or a component that is mechanically connected to the arrangement.

The arrangement may in particular represent a module that is attached to the component structure of a component. For example, the arrangement may be adhesively attached, fitted or floatingly mounted on the component. The modular arrangement can in this case be flexibly designed and adapt itself to a surface of the component. The component is for example a component of an aerial vehicle, such as an aircraft outer skin. Preferably, the component is a control surface of the aerial vehicle, such as for example a leading edge flap or a trailing edge flap of the aerial vehicle. However, it is also possible that the component is a rotor blade area of a wind turbine, and consequently the arrangement is attached on the rotor blade area of a rotor of the wind turbine.

Since the arrangement can be applied to the surface of the component or the component structure as a module, the surface of the arrangement can subsequently form a partial surface of the component or of the component structure. The arrangement may as it were be integrated into the component or the component structure.

According to one embodiment of the disclosure herein, the component structure comprises a material with anisotropic mechanical properties, a fiber composite material, a carbon-fiber reinforced plastic or a material composite comprising these materials.

BRIEF DESCRIPTION OF THE DRAWINGS

FIG. 1 shows an arrangement for mechanically changing a surface according to an example embodiment of the disclosure herein.

FIG. 2 shows an arrangement for mechanically changing a surface with a plurality of piezo elements according to an example embodiment of the disclosure herein.

FIG. 3 shows an arrangement for mechanically changing a surface with a shaped piezo element according to an example embodiment of the disclosure herein.

FIG. 4 shows an arrangement for mechanically changing a surface with an electrical conductor track according to an example embodiment of the disclosure herein.

DETAILED DESCRIPTION

Figure 5:
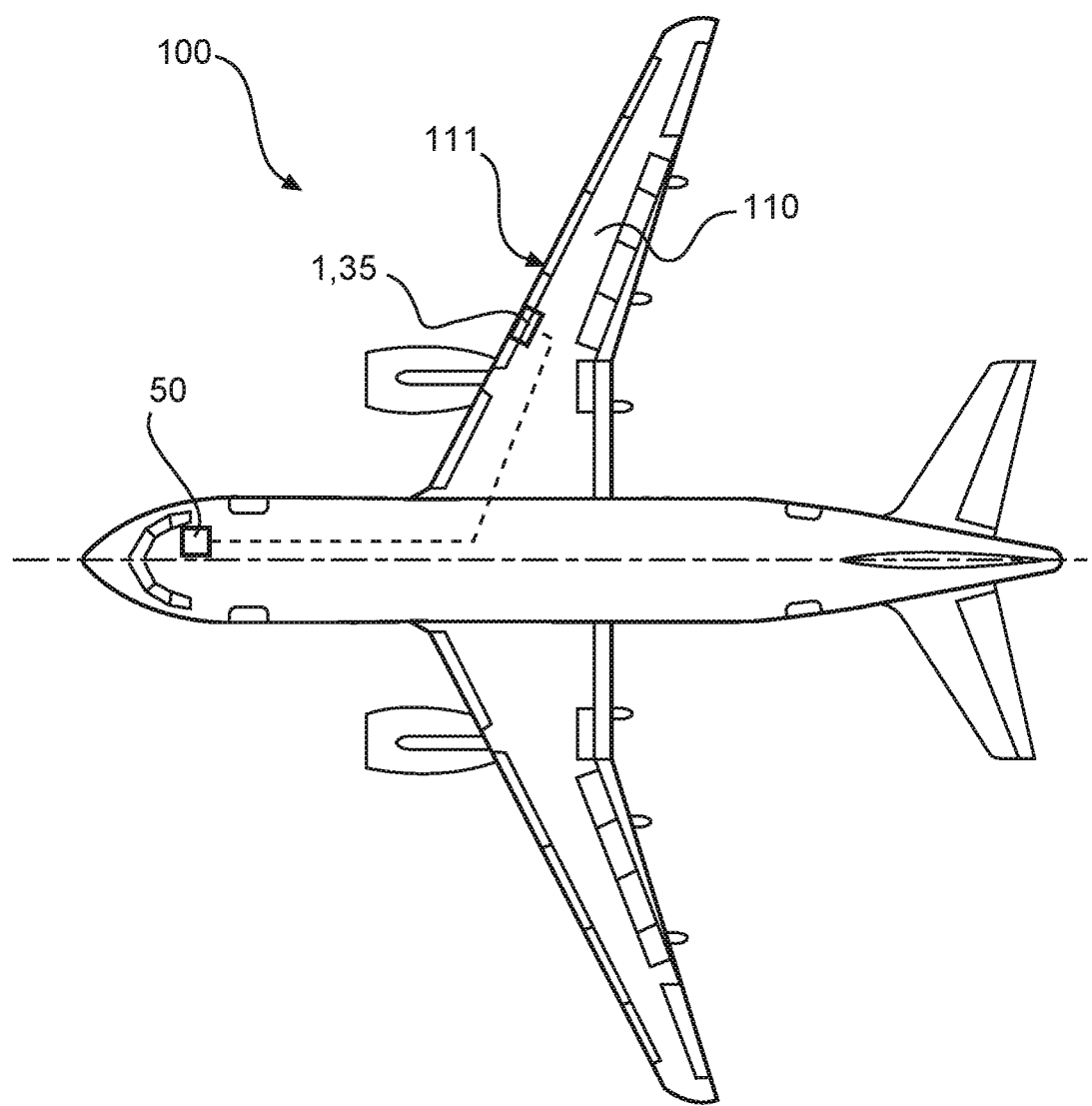
FIG. 5 shows a system for mechanically changing a surface according to an example embodiment of the disclosure herein.

The representations in the figures are schematic and not to scale.

If the same reference signs are used in various figures in the following description of the figures, these reference signs denote identical or similar elements. However, identical or similar elements may also be denoted by different reference signs.

FIG. 1 shows an arrangement 1 for mechanically changing a surface 35. The arrangement comprises an insulating layer 20 with various sub-layers 31, 32, the sub-layers having for example a permittivity of $\square_r=20$. The arrangement also has a pair of electrodes 11, 12, which is arranged within the insulating layer 20, and a piezo element 30, which is arranged on the insulating layer 20 or is connected to it. The piezo element 30 is separated from the pair of electrodes 11, 12 by the insulating layer 20, in particular by the sub-layer 31 of the insulating layer 20, the sub-layer 31 having for example a thickness of 0.2 mm, and consequently the piezo element 30 being kept away from the pair of electrodes 11, 12 with respect to a direction 25 perpendicular to the surface 35 by the distance $d_2$. The distance $d_2$ may, however, also vary locally along the direction of extent of the surface 35. It should be noted that the piezo element does not necessarily have to be arranged underneath the pair of electrodes 11, 12, but may also be arranged approximately in a plane with the pair of electrodes 11, 12. The electrodes of the pair of electrodes 11, 12 may also be arranged underneath the piezo element 30, in order to influence the field pattern of the electric field 13. The electrical contacting of the pairs of electrodes 11, 12 is not represented in FIG. 1.

In the example represented in FIG. 1, the piezo element 30 is formed as an element 30 in the form of a layer or in the form of a sheet, which has a permittivity of about $\square_r=4000$ and a thickness of $d_3=0.5$ mm. The distance or the thickness $d_3$ may be location-dependent, that is to say vary locally in the direction of extent of the surface 35. The piezo element 30 forms a homogeneous layer with piezoelectric properties.

The pair of electrodes 11, 12 is designed to generate in a region 21 of the piezo element 30 an electric field 13, which causes the piezo element 30 to carry out a mechanical change of shape, in order in this way to mechanically change a surface 35 of the arrangement 1. In FIG. 1, the electric field is illustrated by field lines. Furthermore, the region of the piezo element or the region in which piezoelectric properties occur is identified by a dashed circle. It should be understood that the piezo element may, as represented, also extend beyond this region. The piezo element 30 is arranged in the insulating layer 20 in such a way that the mechanical change of shape of the piezo element 30 takes place in response to an exclusive excitation by the electric field 13 generated by the pair of electrodes 11, 12. The piezo element 30 is therefore electrically insulated within the arrangement 1 and is excited just by the electric field 13.

The pair of electrodes 11, 12 is also designed to generate the electric field 13 such that the electric field 13 has a minimum field strength in a surrounding area 22 of the arrangement 1, in order in this way to generate a plasma 22a in the surrounding area 22 of the arrangement 1. As can be seen in FIG. 1, the arrangement 1 represented there has two pairs of electrodes 11, 12, which respectively generate an electric field 13, those regions 21 of the piezo element 30 that interfere with the electric field 13 being excited by it and performing corresponding changes of shape. This allows a locally different change of shape of the different regions 21 of the piezo element 30 to be achieved in each case, in that the two pairs of electrodes respectively generate different electrical field properties in the regions 21.

The arrangement 1 has a bearing surface 36, by way of which the arrangement 1 can be fastened on a component that is not represented or a component structure.

The electrodes of the pairs of electrodes 11, 12 may lie on the surface 35. The pairs of electrodes 11, 12 may, however, also be raised up above the surface 35, for example by up to about 0.1 mm. The insulating layer 20 may comprise a material that has moisture-repellent properties. The material of the insulating layer 20 may also absorb and/or transmit moisture, while the surface 35 itself comprises a material that transmits moisture little or not at all. The surface 35 may form a boundary surface between the insulating layer 20 and ambient air 10 or a surrounding fluid 10. The permittivity of air is about $\square_r=1$.

The individual electrodes represented in FIG. 1 of the pairs of electrodes 11, 12 may be at different distances from one another. In this case, the distance t1 may indicate the distance between the positive electrode and the negative electrode of the first pair of electrodes 11, 12 and the distance t2 may indicate the distance between the negative electrode of the first pair of electrodes 11, 12 and the positive electrode of the second pair of electrodes. In this case, the distances t1 and t2 may be substantially the same. However, it is also possible that the distances t1 and t2 are of different magnitudes. It is also possible that the ratio of t1 to t2 lies between 1 and 5.

FIG. 2 shows an arrangement 1 for mechanically changing a surface 35 with a plurality of piezo elements 30, which are for example arranged in a sub-layer 30a of the insulating layer 20. The piezo element 30 is consequently structured in comparison with the piezo element 30 that is represented in FIG. 1. Furthermore, two pairs of electrodes 11, 12 are provided, designed respectively to generate an electric field 13 in each case in a region 21 in which there is a piezo element 30. These electric fields 13 cause the plurality of piezo elements 30 to perform different mechanical changes of shape in each case, in order in this way to mechanically change a surface 35 of the arrangement 1. This allows a locally different change of shape in the different regions 21 in which the piezo elements 30 are located to be achieved, in that the two pairs of electrodes respectively generate different electrical field properties in the regions 21 of the piezo elements 30.

In addition, by analogy with the example embodiment represented in FIG. 1, again a plasma 22a is also generated by the electric field 13 in the surrounding area 22 of the arrangement 1. In this case, the plasma can assume different properties in different regions of the surrounding area 22, depending on the field strength of the electric fields 13 generated by the pairs of electrodes 11, 12. In FIG. 2, the piezo elements 30 are arranged between a plane in which the pairs of electrodes 11, 12 are located and the bearing surface 36 of the arrangement 1.

FIG. 3 shows an arrangement 1 for mechanically changing a surface 35 with a shaped piezo element 30, in particular an extended piezo element 30, the distance of which from the surface 35 varies locally, while a distance $d_1$ from the surface 35 to a plane in which the pairs of electrodes 11, 12 are arranged is constant along the extent of the surface 35. In this case, a distance $d_2$ between the plane in which the pairs of electrodes 11, 12 are located and different regions of the extending piezo element 30 may be locally different, that is to say location-dependent. The piezo element 30 advantageously follows a specific path over its extent, for example a wave-shaped path. The path of the piezo element 30 is in this case designed such that the electric field lines of the electric fields generated by the pairs of electrodes 11, 12 run in each case substantially perpendicularly to the direction of extent of a partial region 21 of the piezo element 30. Consequently, the effectiveness of the excitation of these partial regions 21 of the piezo element 30 can be particularly controlled, so that the change of shape of the piezo element 30 in these partial regions 21 leads to a specific change of shape of the surface 35 of the arrangement 1. In particular, easier deformation of the piezo element 30 can be achieved as a result. In other words, in the piezo element 30, the field lines that run from the electrodes 11 and 12, respectively, in the direction of the plasma 22a may not run parallel to the piezo element but perpendicularly to it. This allows the degrees of freedom of movement of the piezo element 30 to be increased.

The other properties of this arrangement 1 may correspond to those of FIGS. 1 and 2. It should be noted that the distance $d_1$ may also be zero. In this case, the electrodes of the pairs of electrodes 11, 12 lie on the surface 35. The pairs of electrodes 11, 12 may, however, also be raised up above the surface 35.

Consequently, a specific change of shape of the surface 35 can be brought about by the arrangement and form of the individual elements of the arrangement 1, in particular of the piezo element 30 and the pairs of electrodes 11, 12.

FIG. 4 shows an arrangement 1 for mechanically changing a surface 35 with an electrical conductor track 40. The electrical conductor track 40 is electrically connected to the pairs of electrodes 11, 12, in order to establish an electrical connection between the pairs of electrodes 11, 12 and a separate voltage source 60 or a separate control unit 50.

The control unit 50 can be used to set a voltage or a voltage frequency for the pairs of electrodes 11, 12, in order in this way to vary a degree of ionization of the generated plasma 22a in the surrounding area 22 of the arrangement 1 and/or to vary the mechanical change of shape performed by the piezo element 30. In particular, the voltage source 60 can be used to apply to the pairs of electrodes 11, 12 a frequency that leads to the piezo elements 30 being excited to vibrate, so that a change of shape is obtained in the form of a vibration at the surface 35 of the arrangement 1. A power part of the control unit, for example an amplifier, may be located in the vicinity or on the arrangement and a controller part of the control unit may be arranged separately from it. A logic of the controller part may operate autonomously, so that the overall system can be operated by an on/off switch alone. The other properties of this arrangement 1 may correspond to those of FIGS. 1 and 2.

It is possible by the control unit 50 to provide an adaptation of a high-voltage frequency for optimum operation of the plasma generators, that is to say of the pairs of electrodes 11, 12, an adaptation of the high-voltage frequency for optimum operation of the piezo elements 30, and an adaptation of the high-voltage frequency for optimum operation of the combination of the individual elements of the arrangement 1. Furthermore, the control unit 50 can be used to perform a variation of the high-voltage frequency, in order to realize different operating modes.

According to an option, a high-frequency reversal of the polarity of the electrodes of the pairs of electrodes 11, 12 may take place, in order to produce very quick and also strong deflections or changes of shape. Thermal losses thereby occurring can be positively used as a heating effect.

The insulating layer 20 may be a ply or comprises a ply, for example a film with printed-on conductor tracks 40, which establishes the electrical connection to the electrodes of the pairs of electrodes 11, 12.

FIG. 5 shows a system 100 for mechanically changing a surface 35. The system 100 has an arrangement 1, such as that which has been described with reference to FIGS. 1 to 4, and also a component structure 110, which is mechanically connected to the arrangement 1. The component structure 110 is a wing structure 110, in particular a leading edge flap 111 of a wing structure 110 of an aircraft. The system 100 also has the control unit 50, which is designed to control the arrangement 1, that is to say apply a voltage or voltage frequency to the pairs of electrodes 11, 12 that are present in the arrangement 1, so that the piezo elements 30 that are located in the arrangement 1 are excited to change shape and a plasma is generated over the surface 35 of the arrangement 1. The surface 35 of the arrangement 1 may go over into a surface of the leading edge flap of the aerial vehicle or be integrated in it.

The insertion of a ply, for example a film with printed-on conductor tracks 40, between the piezo element 30 and the component 110 can establish an electrical connection to the electrodes of the pairs of electrodes 11, 12. It is possible that the piezo elements 30 are integrated in this film.

The attachment of the arrangement 1 to the component 110 may take place for example by a hard connection, for example by a hard adhesive. It is also possible to provide a soft connection, such as for example a floating mounting or a connection with a soft polymer, silicone, etc., in order that the bearing surface 36 of the arrangement 1 and the surface of the component 110 can strongly deform locally.

The arrangement 1 according to the disclosure herein may be understood as an actuator structure, which is attached to the component 110. The component 110 may be produced from a material with anisotropic mechanical properties, from fiber composite material, from CRP (carbon-fiber reinforced plastic), GRP (glass-fiber reinforced plastic) or from composite material with embedded metal fibers.

By a coordinated adjustment of the alignment of the piezo elements 30 and a material orientation or an orientation of material fibers, an adapted deformability of the piezo elements 30 can take place, so that an optimum direction-dependent deformability of the arrangement 1 is possible. A resonant frequency can be determined by coordinated adjustment of the component 110 and the arrangement 1 with the piezo elements 30. The component structure 110 or the component 110 may comprise electrically conductive fibers. These fibers can serve as shielding and keep electric fields away from the structure of the component 110 lying under the arrangement 1.

By choosing different frequency ranges for the vibrations caused by the piezo elements 30, shear stresses and/or flexural stresses can be specifically introduced into the component 110, bringing about different effects with regard to de-icing. Consequently, a "de-icing" operating mode (for example blasting off ice) may be provided, and subsequently the generation of the plasma may be activated in an "anti-icing" operating mode, in which modified operation of the piezo elements 30 is provided, so that for example an ice protection layer is specifically applied to the surface 35 by a corresponding fluid.

It should additionally be pointed out that "comprising" does not exclude other elements or steps and "a" or "an" does not exclude more than one. Furthermore, it should be pointed out that features or steps that have been described with reference to one of the above example embodiments can also be used in combination with other features or steps of other example embodiments described above. Designations in the claims should not be regarded as restrictive.

While at least one example embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the example embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An aerial vehicle comprising an arrangement for mechanically changing a surface, the arrangement comprising:
   an insulating layer;
   pairs of electrodes on or in the insulating layer; and
   a piezo element on or in the insulating layer;
   wherein the piezo element is separated from the pairs of electrodes by the insulating layer;
   wherein the pairs of electrodes are configured to generate in locally different regions of the piezo element in each case an electric field, which causes the piezo element to perform different mechanical changes of shape in the locally different regions of the piezo element to mechanically change a surface of the arrangement; and
   wherein the pairs of electrodes are configured to generate the electric field such that the electric field has a minimum field strength in a surrounding area of the arrangement to generate a plasma in the surrounding area of the arrangement.

2. The aerial vehicle according to claim 1, wherein the piezo element is arranged in or on the insulating layer such that the mechanical change of shape of the piezo element takes place in response to an exclusive excitation by the electric field generated by the pairs of electrodes.

3. The aerial vehicle according to claim 1, wherein the piezo element is electrically insulated within the arrangement.

4. The aerial vehicle according to claim 1, wherein the pairs of electrodes are arranged with respect to the piezo element such that the generated electric field in the region of the piezo element has a field strength that does not exceed a maximum field strength.

5. The aerial vehicle according to claim 1, comprising a control unit configured to set a voltage or a voltage frequency for the pairs of electrodes to vary a degree of ionization of the generated plasma in the surrounding area of the arrangement and/or vary the mechanical change of shape performed by the piezo element.

6. The aerial vehicle according to claim 1, comprising:
   a plurality of piezo elements;
   wherein the pairs of electrodes are configured to generate in the region of the plurality of piezo elements an electric field that causes the plurality of piezo elements to perform in each case different mechanical changes of shape to mechanically change a surface of the arrangement.

7. The aerial vehicle according to claim 1, wherein the piezo element is integrated in a film.

8. The aerial vehicle according to claim 1, comprising an electrical conductor track, which is electrically connected to the pairs of electrodes to establish an electrical connection between the pairs of electrodes and a separate voltage source.

9. The aerial vehicle according to claim 1, wherein respective distances between the pairs of electrodes and the piezo element are variable with respect to a direction perpendicular to the surface between different regions of the piezo element.

10. The aerial vehicle according to claim 1, wherein the piezo element is in a form of a layer or sheet that keeps the insulating layer at a distance from the bearing surface and is shaped such that the distance between the insulating layer and a bearing surface of the arrangement is variable with respect to a direction perpendicular to the surface.

11. The aerial vehicle according to claim 1, wherein the insulating layer comprises a permittivity that changes, in a direction perpendicular to the surface of the arrangement, from the surface towards the piezo element.

12. The aerial vehicle according to claim 1, comprising a component structure mechanically connected to the arrangement.

13. The aerial vehicle according to claim 12, wherein the component structure comprises a material with anisotropic mechanical properties, a fiber composite material, a carbon fiber reinforced plastic or a material composite of these materials.

* * * * *